United States Patent [19]
Caine et al.

[11] Patent Number: 5,225,789
[45] Date of Patent: Jul. 6, 1993

[54] FOUR QUADRANT CURRENT MODE SWITCHING AMPLIFIER

[75] Inventors: Steven L. Caine, Lawrenceville, Ga.; Mahlon D. Kimbrough, Grapevine, Tex.

[73] Assignee: Northern Telecom Limited, Montreal, Canada

[21] Appl. No.: 870,472

[22] Filed: Apr. 17, 1992

[51] Int. Cl.[5] ............................................. H03F 3/38
[52] U.S. Cl. ................................... 330/10; 330/251
[58] Field of Search ............... 330/10, 51, 146, 207 A, 330/251

[56] References Cited

U.S. PATENT DOCUMENTS 4,554,512 11/1985 Aiello ..................................... 330/10

Primary Examiner—Steven Mottola
Attorney, Agent, or Firm—Foley & Lardner

[57] ABSTRACT

A four quadrant current mode switching amplifier is provided. The switching amplifier includes a pulse width modulator (PWM) programmed by an error voltage derived from an analog input voltage and the amplified output voltage. The PWM is also provided with negative current mode feedback in all four quadrants of operation. A logic device controls the switching topology to source, or sink power for the load and to provide negative or positive output in dependence upon sign and slope bits, derived from the input and output voltages, and the PWM output.

12 Claims, 3 Drawing Sheets

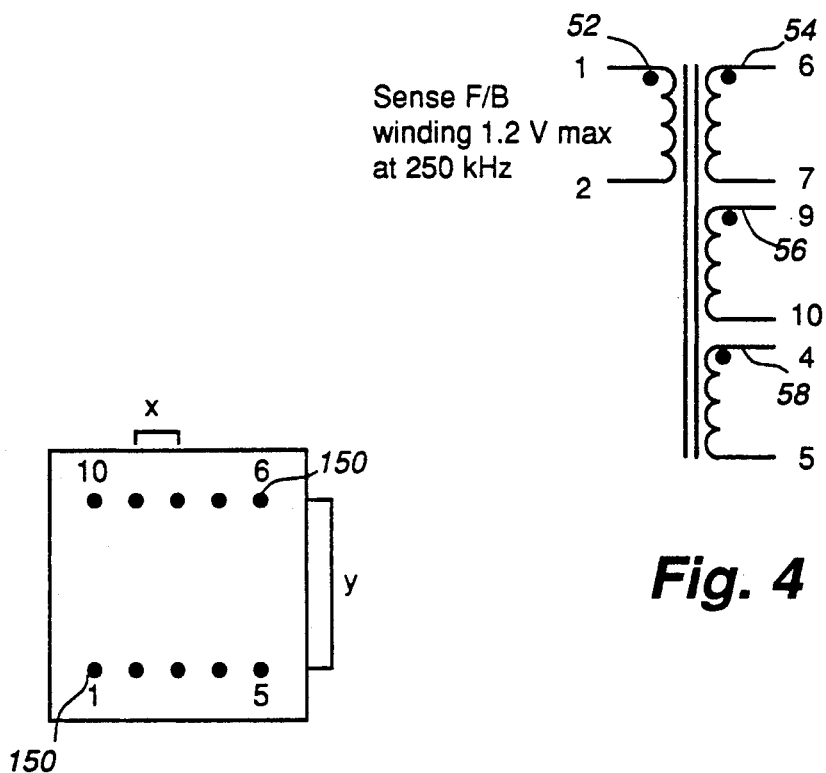
Fig. 4
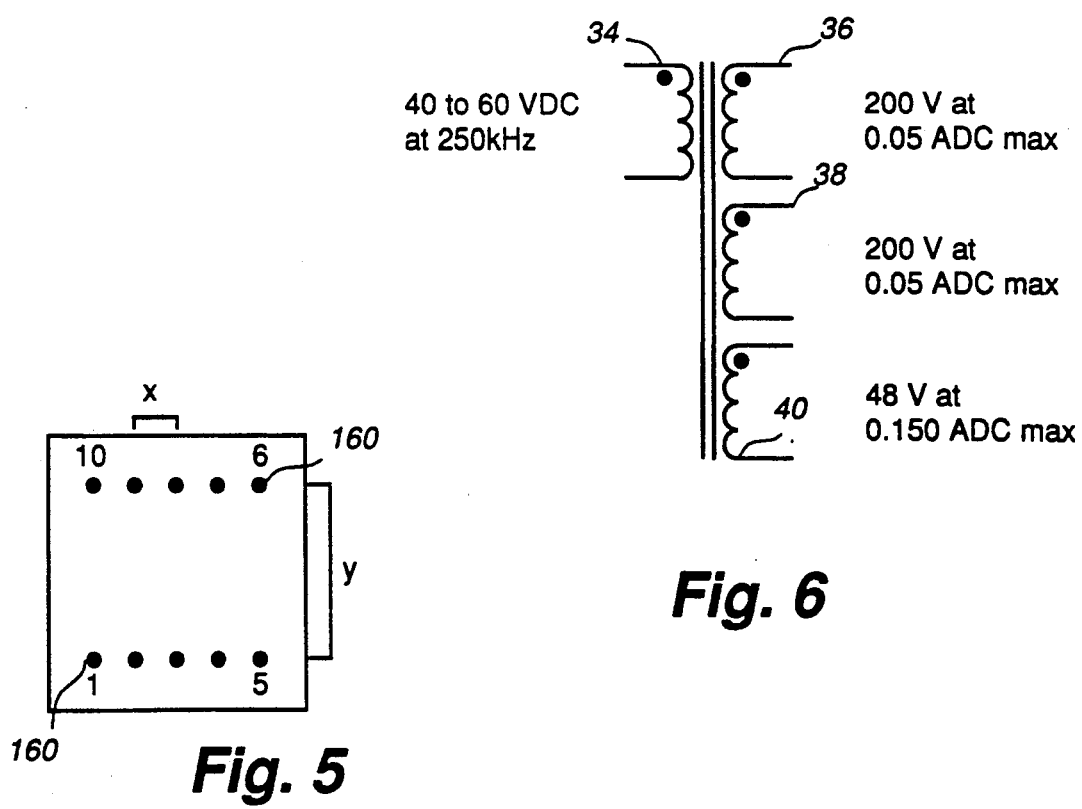
Fig. 3
Fig. 5
Fig. 6

FOUR QUADRANT CURRENT MODE SWITCHING AMPLIFIER

This invention relates to a four quadrant mode switching amplifier and is particularly concerned with a switching topology which provides negative current mode feedback in all four quadrants of operation.

BACKGROUND OF THE INVENTION

A conventional high voltage linear amplifier arrangement has two separate blocks, a high voltage power supply converter (i.e. DC to DC) to provide high voltage DC to power a linear amplifier, and a linear amplifier that takes an analog reference input voltage and amplifies it by a desired gain factor. The disadvantages with this conventional arrangement are relatively high numbers and size of components, power efficiency, cost and reliability.

SUMMARY OF THE INVENTION

An object of the present invention is to provide an improved four quadrant current mode switching amplifier.

In accordance with the present invention there is provided A four quadrant current mode switching amplifier, comprising: an input terminal for accepting an analog input voltage; an output terminal for providing an amplified output voltage; a switching topology power converter having inputs for accepting a direct current source of electrical energy and the output terminal; means for generating sign and slope signals in dependence upon the input and output voltages; means for generating an error voltage signal in dependence upon the input and output voltages; means for sensing current in the switching topology power converter; means for generating a width modulated pulse, at a first rate, connected to said means for generating an error voltage signal and said means for sensing current, in dependence upon the error voltage signal and the sensed current; means for controlling the switching topology power converter, at a second rate, lower than the first rate, in dependence upon the width modulated pulse, the sign signal and the slope signal.

In an embodiment of the present invention the means for sensing current includes a current sensing transformer.

An advantage of the present invention is providing the equivalent response of a high voltage linear amplifier with a switching converter topology. This reduces the number and size of components needed thereby providing a more efficient and reliable circuit, with lower cost and power.

BRIEF DESCRIPTION OF THE DRAWINGS

The present invention will be further understood from the following description with reference to the drawings in which:

FIG. 3 illustrates in plan view the current sensing transformer;

FIG. 4 schematically illustrates the current sensing transformer;

FIG. 5 illustrates in plan view the power transformer; and

FIG. 6 schematically illustrates the power transformer.

Similar references are used in different figures to denote similar components.

DETAILED DESCRIPTION

Figure 1:
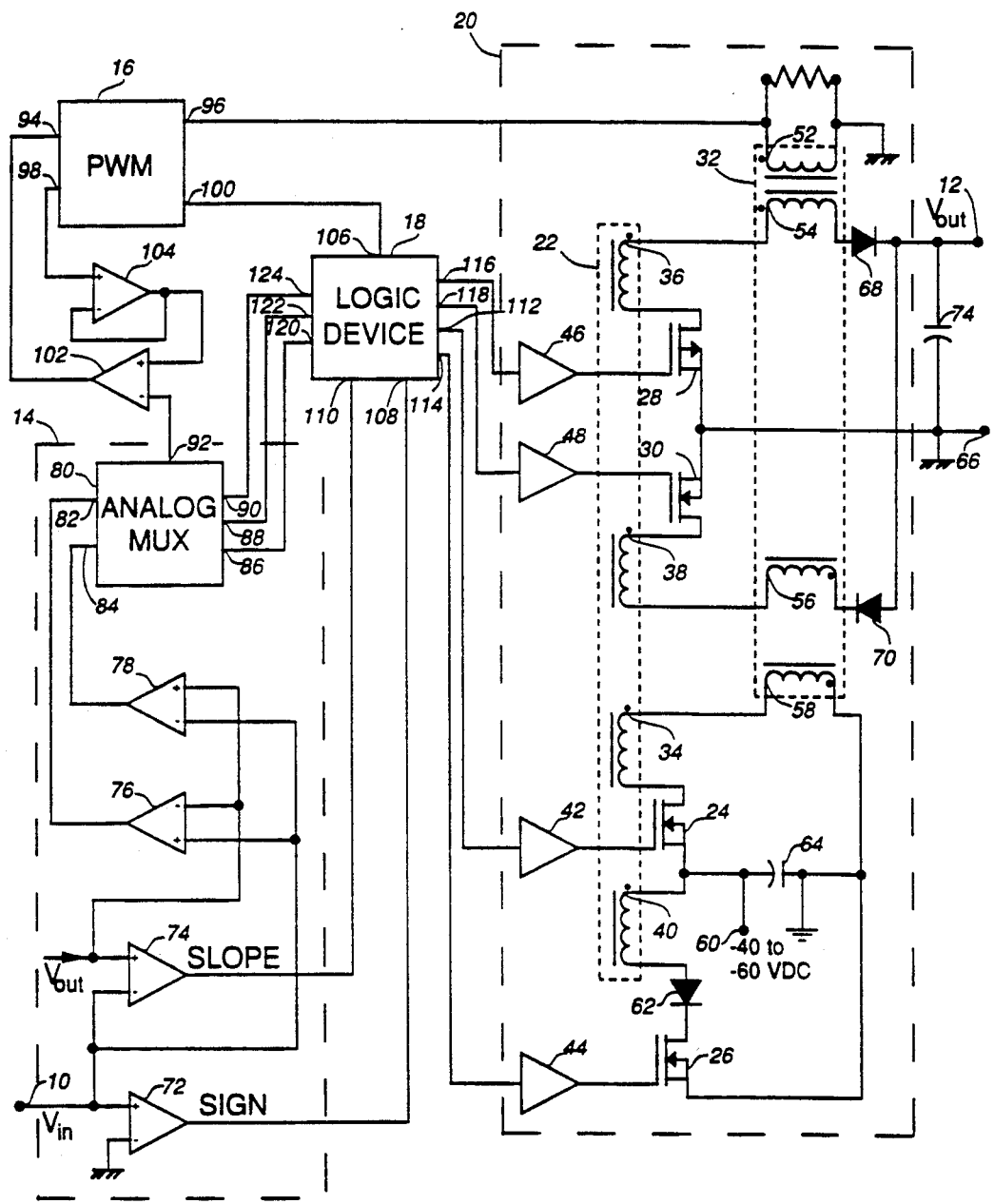
FIG. 1 illustrates a functional block diagram of a four quadrant current mode switching amplifier in accordance with an embodiment of the present invention.

Referring to FIG. 1, there is illustrated, in a block diagram, a four quadrant current mode switching amplifier in accordance with an embodiment of the present invention. The four quadrant current mode switching amplifier includes an analog signal input 10, an amplified signal output 12, an error voltage circuit 14, to which both the input 10 and output 12 are connected, a pulse width modulator (PWM) 16 coupled to the error voltage circuit 14, a logic device 18 connected to the PWM 16, and a switching topology 20, coupled to the logic device 18, and connected to the amplified signal output 12. The switching topology 20 includes a power transformer 22, four FET switches 24, 26, 28, and 30 and a current sensing transformer 32. Conveniently, the FET switches 24, 26, 28, and 30 are referred to as primary, load drain, positive ground, and negative ground, respectively. The power transformer 22 has a primary winding 34 and three secondary windings 36, 38, and 40. The logic device 18 is connected to the switching topology via buffers 42, 44, 46, and 48 and the gates of FET switches 24, 26, 28, and 30, respectively. The current sensing transformer 32 has a primary winding 52 and three secondary windings 54, 56, and 58. Conveniently, the secondary windings 54, 56, and 58 are referred to as positive current sense, negative current sense and primary current sense, respectively.

On the power input side of the switching topology 20, battery power (−40 to −60 V) is applied between a negative battery input 60 and ground. The primary FET switch 24, power transformer primary winding 34 and the primary current sense secondary winding 58 are series connected between the negative battery input 60 and ground. The power transformer secondary winding 40, diode 62 with cathode side toward ground, and the load drain FET switch 26 are also series connected between the negative battery input 60 and ground. The negative battery input 60 is filtered to ground via a capacitor 64.

On the power output side of the switching topology 20, power output is provided between the amplified signal output 12 and a return terminal 66 that is connected to ground. The positive ground FET switch 28, the power transformer secondary winding 36, the positive current sense secondary winding 54, and a diode 68, with the cathode side toward the output 12, are series connected between the return terminal 66 and the amplified signal output 12. A diode 70, with the anode side toward the output 12, the negative current sense secondary winding 56, the power transformer secondary winding 38, and the negative ground FET switch 30, are series connected between the amplified signal output 12 and the return terminal 66.

The error voltage circuit 14 includes comparators 72 and 74, difference amplifiers 76 and 78, and an analog MUX 80. The analog signal input 10 is connected to noninverting inputs of comparator 72 and amplifier 76 and inverting inputs of comparator 74 and amplifier 78. The amplified signal output 12 is connected to noninverting inputs of comparators 74 and amplifier 78 and the inverting input of amplifier 76. The inverting input of comparator 72 is connected to ground. Outputs of comparators 72 and 74 are connected to the logic device 18 and provide sign and slope signals, respectively. Outputs of amplifiers 76 and 78 are connected to the analog MUX 80 via inputs 82 and 84, respectively. The analog MUX 80 also has inputs 86, 88, and 90 connected to the logic device 18 for receiving an enable signal, MUXEN, a synchronized sign signal, RSIGN, and a synchronized slope signal, RSLOPE, respectively from the logic device 18. The analog MUX has an output 92.

The PWM 16 has feedback and sense inputs 94 and 96, a reference voltage output 98 and a pulse output 100. The analog MUX 80 is coupled to the PWM 16 via a amplifier 102, the output 92 being connected to the inverting input of amplifier 102. The reference voltage output 98 is connected to the noninverting input of amplifier 102 via a voltage follower 104. The primary winding 52 of the current sensing transformer 32 is connected to the sense input 96 of PWM 16 to provide current mode feedback from the switching topology 20.

The logic device 18 has a pulse input 106, sign input 108 and slope input 110. The pulse output 100 of PWM 16 is connected to the pulse input 106 of the logic device 18. The sign and slope inputs 108 and 110 are connected to the output of comparators 72 and 74, respectively. The logic device 18 has drive outputs 112, 114, 116, and 118 connected to buffers 42, 44, 46, and 48, respectively. The logic device 18 also has MUX enable, synchronized sign and synchronized slope signal outputs 120, 122, and 124, respectively, connected to the inputs 86, 88, and 90, respectively, of MUX 80.

In operation, an amplified output signal $V_{out}$, of $-200$ to $+200$ V, is generated by taking the difference, using amplifiers 76 and 78, between the analog input signal $V_{in}$, of $-45$ to $+45$ V, and the output signal $V_{out}$ to produce an error signal $V_{error}$. The analog MUX 80 selects the positive $V_{error}$ in dependence upon values of slope and sign bits, referred to as SIGN and SLOPE, applied to inputs 88 and 90, respectively. The error signal $V_{error}$ is then subtracted from a reference voltage signal $V_{ref}$, supplied by output 98 of the PWM 16, using the amplifier 102, to form a primary inductor current programming voltage $V_{fb}$ used to modulate the pulse width produced by the PWM 16.

The sign bit, SIGN, is derived from the analog input signal $V_{in}$ by comparing it to ground, to determine if it is positive or negative, using the comparator 72. The slope bit, SLOPE, is derived by comparing the output signal $V_{out}$ to the input signal $V_{in}$, using comparator 74 to determine if the output signal $V_{out}$ should be raised or lowered relative to the input signal $V_{in}$. The switching topology 20 is changed dynamically to either source current or sink current in dependence upon the sign and slope bits supplied to the logic device 18 via inputs 108 and 110. The logic device 18 also synchronizes the sign and slope bits SIGN and SLOPE to provide synchronized sign and slope bits, RSIGN and RSLOPE.

The switching topology 20 is operated as follows. When the primary 34 of the power transformer 22 is supplying energy to a load connected to the output 12 and return terminal 66, the primary FET switch 24 is turned on and one of the two output FET switches 28 (positive ground) or 30 (negative ground) is turned on, depending upon the desired output polarity. When energy must be removed from the load, the primary FET switch 24 is turned off and the load drain FET switch 26 is turned on. The appropriate output FET switch 28 or 30, is then used as the primary switching device and is modulated by the PWM 16. Thus, the load drain FET switch 26 becomes the energy dump path for draining the load and returning the energy into the source capacitor 64. Depending upon the state of the SIGN and SLOPE bits, one of the three FET switches 24, 28 or 30 is used as the modulated primary, thereby allowing the switching topology 20 to source or sink current as required, with either a positive or negative output voltage, thus, providing four quadrant operation.

The current sensing transformer 32 provides current feedback to the pulse width modulator 16 by having a secondary winding in each of the three loops in which the FET switch can act as the primary switching device modulated by the PMW 16. That is, when the primary FET switch 24 is turned on, the primary current sense secondary winding 58 provides current mode feedback, via the primary winding 52 of the current sensing transformer 32, to the PWM 16.

When the primary FET switch 24 is turned off and the positive ground FET switch 28 is turned on, the positive current sense secondary winding 54 provides current mode feedback to the PWM 16. Similarly, when the primary FET switch 24 is turned off and the negative ground FET switch 30 is turned on, the negative current sense secondary winding 56 provides current mode feedback to the PWM 16. This switching of feedback allows negative current mode feedback in all four quadrants of operation.

Before describing in detail how this is accomplished a description of the remaining inputs to and outputs from the pulse width modulator 16 and the logic device 18 is required.

Figure 2:
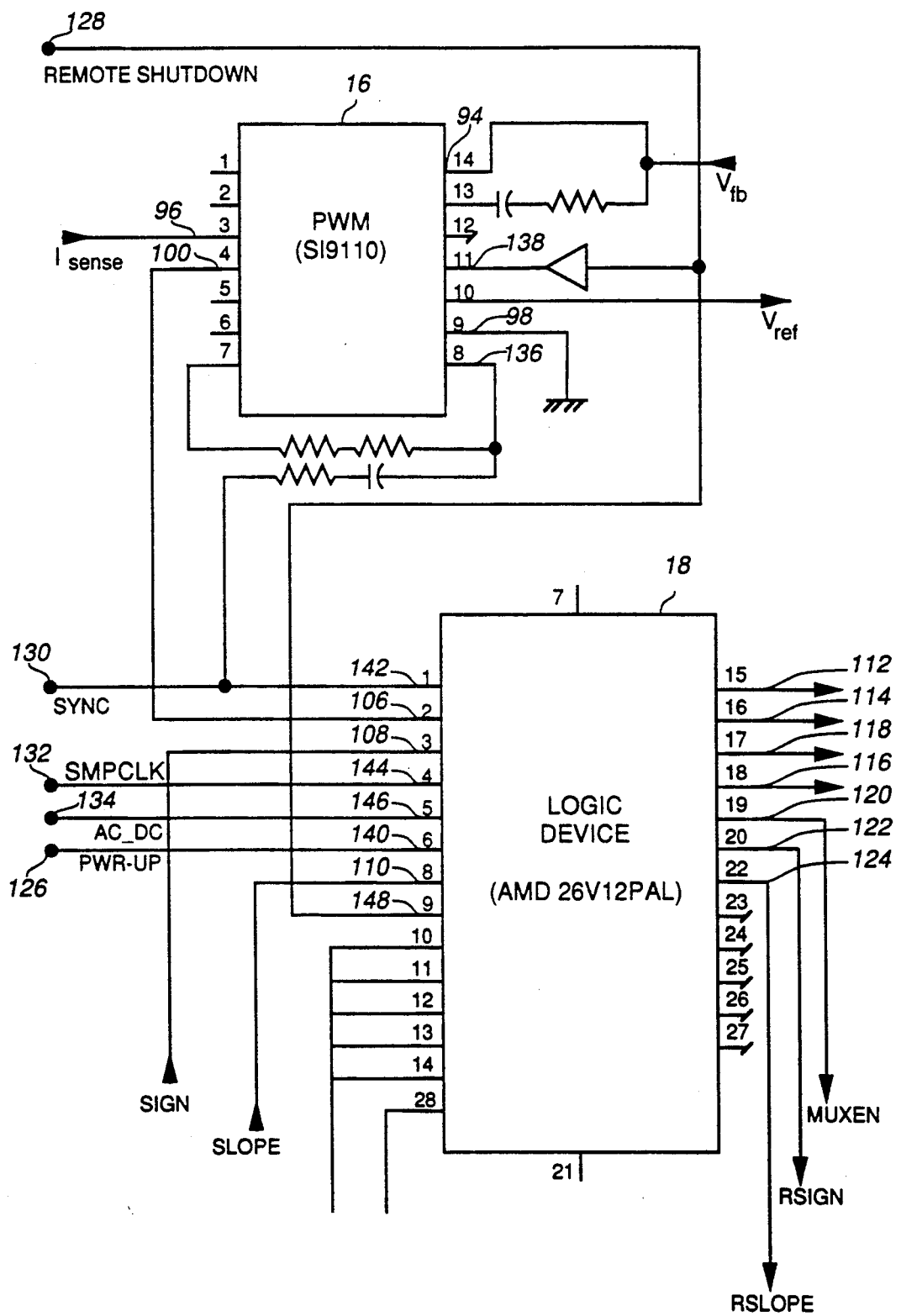
FIG. 2 schematically illustrates detail of the pulse width modulator and logic device of the four quadrant current mode switching amplifier of FIG. 1.

Referring to FIG. 2, there is schematically illustrated, detail of the pulse width modulator and logic device of the four quadrant current mode switching amplifier of FIG. 1. The present embodiment of the four quadrant current mode switching amplifier has additional inputs not shown in FIG. 1 to simplify the description of the circuit. The additional inputs, illustrated in FIG. 2, are a power-up reset input 126, a remote shutdown input 128, an external clock input 130, a sample rate clock input 132, and an AC-DC mode select input 134.

In FIG. 2, the PWM 16 is provided by a SI9110 integrated circuit, by Siliconix. The SI9110 integrated circuit used has a 14 pin package. The feedback and sense inputs 94 and 96, a reference voltage output 98 and a pulse output 100 of PWM 16 are provided by SI9110 pins 14, 3, 10, and 4, respectively. The external clock input 130 is connected to an oscillator input 136 (SI9110, pin 8). The remote shutdown input 128 is connected to a shutdown input 138 (SI9110, pin 11).

In FIG. 2, the logic device 18 is provided by a programmable array logic, specifically an AMD 26V12 PAL by Advanced Micro Devices. The AMD 26V12 PAL used has a 28 pin package. The pulse input 106, sign input 108 and slope input 110 are provided by AMD 26V12 PAL pins 2, 3, and 8, respectively. The power-up reset input 126 is connected to an input 140 (AMD 26V12, pin 6). The external clock input 130 is connected to an input 142 (AMD 26V12, pin 1). The sample clock input 132 is connected to input 144 (AMD 26V12, pin 4). The AC-DC mode select input 134 is connected to an input 146 (AMD 26V12, pin 5). The remote shutdown input 128 is connected to an input 148 (AMD 26V12, pin 9). Details of the ADM 26V12 PAL input and outputs and the boolean equations that describe its internal logic are summarized in Table A.

TABLE A

| NAME | PIN | DESCRIPTION |
|---|---|---|
| INPUTS | | |
| SYNC | pin 1 | 480 kHz sync clock input |
| PWM | pin 2 | pulse width modulator input |
| SIGNIN | pin 3 | asynchronous sign bit input |
| SMPCLK | pin 4 | low frequency (60 kHz) sample clock |
| AC_DC | pin 5 | ac or dc mode select |
| RESET | pin 6 | master reset line (turns off all FETs) |
| SLOPEIN | pin 8 | asynchronous slope bit input |
| SHTDWN | pin 9 | shutdown input to PAL |
| TRISTATE | pin 28 | testability tristate pin |
| OUTPUTS | | |
| PRIMFET | pin 15 | primary FET drive output |
| LOADDRAIN | pin 16 | load drain drive output |
| NEGGND | pin 17 | negative ground drive output |
| POSGND | pin 18 | positive ground drive output |
| MUXEN | pin 19 | mux enable |
| RSIGN | pin 20 | synchronized sign bit |
| RSLOPE | pin 22 | synchronized slope bit |

H, L, X, Z = 1, 0, .X., .Z.;
equations
assign clocks
[RSIGN.c, RSLOPE.c] = SMPCLK;
logic definitions: boolean equation definition
  ! = logical inversion
  # = logical or
  $ = logical exclusive or
  & = logical and
  H = logical 1
  L = logical 0
  X = don't care
  Z = tristate
RSIGN: = SIGNIN;
RSLOPE: = (!AC.DC & SLOPEIN) # (AC.DC & SIGNIN);
PRIMFET = !(!SHTDWN & RESET & ((AC.DC & PWM)
     # (PWM & !AC.DC & !(RSIGN $ RSLOPE))));
LOADDRAIN = !(!SHTDWN & RESET & ((!AC.DC &
!RSIGN & RSLOPE)
     # (!AC.DC & RSIGN & !RSLOPE)));
NEGGND = !(!SHTDWN & RESET &
     ((!AC.DC & RSIGN & !RSLOPE & PWM)
     # (!RSIGN & !RSLOPE)
     # ( !RSIGN & AC.DC & RSLOPE)));
POSGND = !(!SHTDWN & RESET &
     ((!AC.DC & !RSIGN & RSLOPE & PWM)
     # (RSIGN & RSLOPE) # ( RSIGN & AC.DC)));
MUXEN = H;

In operation, the external clock input 130 provides a 480 kHz clock signal, SYNC, is used to generate the modulation pulse in the PWM 16. The sample rate clock input 132 provides a 60 kHz output sample clock, SMPCLK, used by the logic device 18 as the switching rate for the switching topology 20. SMPCLK is used to synchronize the SIGN and SLOPE bits in the logic device 18. The lower rate of change in the output switching topology allows the PWM 16 time to regulate the voltage.

The power-up reset input 126 provides a logic '0' when a reset is required. The remote shutdown input 128 provides a logic '1' when remote shutdown is required. The AC-DC mode select input 134 provides a logic '0' to indicate AC operation and a logic '1' to indicate DC operation.

In the present embodiment, the power and current sense transformers have characteristics that are specified hereinbelow in conjunction with FIGS. 3-6 and Tables B-E.

The current sensing transformer 32 senses both the primary current on a flyback winding (2 amps peak) as well as two 200 volt 50 mA windings. Operating frequency is 250 kHz and sense winding terminates into a 2.2 ohm resistor. Package was chosen because of a 0.6 inch maximum height restriction and a need for 8 pins minimum with spacing between them for the high voltage.

A plan view of the current sensing transformer is illustrated in FIG. 3. The current sensing transformer has ten pins 150 arranged in two rows of five pins each. Pin spacing is x=0.10 in. nominal. Row spacing is y=0.55 in. nominal. The remaining physical dimensions are:

Package name: TT14/8-10
Height 0.375 in.
Width: 0.60 in.
Pin length (past standoff) : 0.175 in Max −0.125 in. Min
Pin outside diameter : 0.015 in. by 0.042 in. Nominal The current sensing transformer electrical characteristics are provided in Table B.

TABLE B

| Parameter | Terminals Under Test | Max | Min | Unit |
|---|---|---|---|---|
| Breakdown voltage (DWV) V ac for 1 s | Each winding to all others and core. | — | 1500 | V |
| DC insulation res at 500 V dc −/− 10% | Each winding to all others and core. | — | 500 | meg ohms |
| DC resistance at 20 degrees celsius (Valhalla 4100) | (1-2) | 0.100 | — | ohms |
| | (4-5) | 0.012 | — | |
| | (6-7) | 0.072 | — | |
| | (9-10) | 0.080 | — | |
| Transformation ratio at 0.1 V ac, 20 kHz (Waynekerr 3245) | (1-2):(6-7) | 1.08 | 0.92 | |
| | (1-2):(9-10) | 1.08 | 0.92 | |
| | (1-2):(4-5) | 3.6 | 3.066 | |
| Inductance at 0.1 V ac, 20 kHz and 0.0 A dc (Waynekerr 3245) | (1-2) | — | 131 | μH |
| Leakage inductance at 0.01 V ac, 100 kHz (HP4192A) | (1-2) strap (4-5) (1-2) strap (6-7) (1-2) strap (9-10) | | | μH |

The current sensing transformer winding instructions are provided in Table C.

TABLE C

| Wdg No | Total Turns Parallel | St No | Pin | Wire Item No* | Tap. Turn. Note* | Turns Per Layer | Layers Shared Margin | Over Wrap |
|---|---|---|---|---|---|---|---|---|
| 1 | 10.0 1 | 1 | (6-7) | 21 | | 11 | 1 NO | 2.0 of item 22 |
| 2 | 10.0 1 | 1 | (9-10) | 21 | | 11 | 1 NO | 2.0 of item 22 |
| 3 | 3.0 P3 | 1 2 3 | (4-5) (4-5) (4-5) | 21 21 21 | | 3 P3 | 1 NO | 2 0 of item 22 |
| 4 | 10.0 1 | 1 | (1-2) | 21 | | 11 | 1 NO | 2.0 of item 22 |

A schematic for the current sensing transformer is illustrated in FIG. 4.

The power transformer 22 has been developed as a discontinuous flyback for operation in a ringing circuit. Frequency of operation is 250 kHz with a −40 to −60 volt battery input range. The 120 volt outputs are connected together to enable generation of a sine wave hence the worst case power output is with only one of the 120 volt outputs and the −48 volt on at the same time.

A plan view of the power transformer is illustrated in FIG. 5. The power transformer has ten pins 160 arranged in two rows of five pins each. Row spacing is y=0.80 in. nominal. The remaining physical dimensions are:

Package name: TT23/11-10
Length: 1.10
Pin length (past standoff) : 0.175 in. Max 0.125 in. Min
Pin outside diameter : 0.015 in. by 0.045 in. Nominal The power transformer electrical characteristics are provided in Table D. The current sensing transformer winding instructions are provided in Table E.

TABLE D

| Parameter | Terminals Under Test | Value Max | Value Min | Unit |
|---|---|---|---|---|
| Breakdown voltage (DWV) V ac for 1 s | Each winding to all others and core. | — | 1500 | V |
| DC insulation res at 500 V dc −/− 10% | Each winding to all others and core. | — | 500 | meg ohms |
| DC resistance at 20 degrees celsius (Valhalla 4100) | (1-2) | 0.122 | — | ohms |
| | (5-4) | 0.235 | — | |
| | (6-7) | 2.859 | — | |
| | (9-10) | 2.572 | — | |
| Transformation ratio at 0.1 V ac, 20 kHz (Waynekerr 3245) | (6-7):(9-10) | 1.015 | 0.984 | |
| | (6-7):(1-2) | 3.586 | 3.48 | |
| | (6-7):(5-4) | 4.138 | 4.015 | |
| 0.1 V ac, 20 kHz and 0.0 A dc | (1-2) | 37.8 | — | μH |
| 4.0 A dc (Waynekerr 3245) | (1-2) | — | 32.4 | |
| Leakage inductance at 0.01 V ac, 100 kHz (HP4192A) | (1-2) strap (4-5) | 1.20 | | μH |
| | (1-2) strap (10-9) | 1.10 | | |
| | (1-2) strap (7-6) | 2.00 | | |
| Self resonant Frequency. (HP4192A) | (1-2) | | 1.1 | MHz |

TABLE E

| Wdg No | Total Turns. Parallel | St. No | Pins | Winding Instructions Wire Item No* | Tap. Trun. Note* | Turns Per Layer | Layers Shared Margin | Over Wrap | Inter Layer Wrap |
|---|---|---|---|---|---|---|---|---|---|
| 1 | 15.0 1 | 1 | (1-2) | 21 | | 16 | 1 NO | 2.0 of item 22 | |
| 2 | 53.0 1 | 1 | (9-10) | 23 | | 28 | 2 NO | 2.0 of item 22 | 2.0 of item 22 |
| 3 | 53.0 1 | 1 | (6-7) | 23 | | 28 | 2 NO | 2.0 of item 22 | 2.0 of item 22 |
| 4 | 13.0 1 | 1 | (5-4) | 21 | | 16 | 1 NO | 2.0 of item 22 | |
| 5 | 15.0 1 | 1 | (1-2) | 21 | | 16 | 1 NO | 2.0 of item 22 | |

A schematic for the power transformer is illustrated in FIG. 6.

Numerous modifications, variations and adaptations may be made to the particular embodiments of the invention described above without departing from the scope of the invention, which is defined in the claims.

What is claimed is:

1. A four quadrant current mode switching amplifier, comprising:

an input terminal for accepting an analog input voltage;
an output terminal for providing an amplified output voltage;
a switching topology power converter having inputs for accepting a direct current source of electrical energy and the output terminal;
means for generating sign and slope signals in dependence upon the input and output voltages;
means for generating an error voltage signal in dependence upon the input and output voltages;
means for sensing current in the switching topology power converter;
means for generating a width modulated pulse, at a first rate, connected to said means for generating an error voltage signal and said means for sensing current, in dependence upon the error voltage signal and the sensed current;
means for controlling the switching topology power converter, at a second rate, lower than the first rate, in dependence upon the width modulated pulse, the sign signal and the slope signal.

2. A switching amplifier as claimed in claim 1 wherein the switching topology power converter includes a power transformer and a current sensing transformer.

3. A switching amplifier as claimed in claim 1 wherein the switching topology power converter comprises a primary power circuit and a secondary output circuit.

4. A switching amplifier as claimed in claim 3 wherein the switching topology power converter includes a power transformer and a current sensing transformer and the primary power circuit includes a first electronic switch, a primary winding of the power transformer and a first secondary winding of the current sensing transformer series connected between the inputs for electric energy.

5. A switching amplifier as claimed in claim 4 wherein the primary power circuit includes a first secondary winding of the power transformer, a diode and an electronic switch series connected between the inputs of electrical energy.

6. A switching amplifier as claimed in claim 5 wherein the secondary output circuit includes a third electronic switch, a second secondary winding of the power transformer, a second secondary winding of the current sense transformer and a diode series connected between ground and the output terminal.

7. A switching amplifier as claimed in claim 6 wherein the secondary output circuit includes a diode, a third secondary winding of the current sense transformer, a third secondary switching of the power transformer and a fourth electronic switch series connected between the output terminal and ground.

8. A switching amplifier as claimed in claim 7 wherein the means for controlling the switching topology power converter includes a logic device having control outputs connected to the four electronic switches.

9. A switching amplifier as claimed in claim 8 wherein the logic device controls the first electronic switch in accordance with the boolean equation:

$$PRIMPET = ((AC\text{-}DC \text{ AND } PWM) \text{ OR } (NOT\text{ }AC\text{-}DC \text{ AND } NOT (RESIGN \text{ XOR } RSLOPE))$$

where AC-DC is the mode bit 0 means AC, 1 means DC
PWM is the width modulated pulse value
RSIGN is the sign signal value synchronized to the second rate
RSLOPE is the slope signal value synchronized to the second rate.

10. A switching amplifier as claimed in claim 8 wherein the logic device controls the second electronic switch in accordance with the boolean equation:

$$LOADDRAIN = ((NOT\text{ }AC\text{-}DC \text{ AND } NOT \text{ } RSLOPE) \text{ OR } (not\text{ }AC\text{-}DC \text{ and } RSIGN \text{ AND } NOT \text{ } RSLOPE))$$

where
AC-DC is the mode bit 0 means AC, 1 means DC
PWM is the width modulated pulse value
RSIGN is the sign signal value synchronized to the second rate
RSLOPE is the slope signal value synchronized to the second rate.

11. A switching amplifier as claimed in claim 8 wherein the logic device controls the third electronic switch in accordance with the boolean equation:

$$POSGND = NOT ((NOT\text{ }AC\text{-}DC \text{ AND } NOT \text{ } RSIGN \text{ AND } RSLOPE \text{ AND } PWM) \text{ OR } (RSIGN \text{ AND } RSLOPE) \text{ OR } (RSIGN \text{ AND } AC\text{-}DC))$$

where
AC-DC is the mode bit, 0 means AC, 1 means DC
PWM is the width modulated pulse value
RSIGN is the sign signal value synchronized to the second rate
RSLOPE is the slope signal value synchronized to the second rate.

12. A switching amplifier as claimed in claim 8 wherein the logic device controls the fourth electronic switch in accordance with the boolean equation:

$$NEGGND = NOT (NOT\text{ }AC\text{-}DC \text{ AND } RSIGN \text{ AND } NOT \text{ } RSLOPE \text{ AND } PWM)$$

OR (NOT RSIGN AND NOT SLOPE)
OR (NOT RSIGN AND AC-DC AND RSLOPE))
where
AC-DC is the mode bit 0 means AC, 1 means DC
PWM is the width modulated pulse value
RSIGN is the sign signal value synchronized to the second rate
RSLOPE is the slope signal value synchronized to the second rate.

* * * * *